United States Patent
Zell

(10) Patent No.: US 10,042,003 B2
(45) Date of Patent: Aug. 7, 2018

(54) FAULTY CIRCUIT DETECTION OF SHUT OFF VALVE

(71) Applicant: Goodrich Corproation, Charlotte, NC (US)

(72) Inventor: Brian Keith Zell, Dayton, OH (US)

(73) Assignee: GOODRICH CORPORATION, Charlotte, NC (US)

(*) Notice: Subject to any disclaimer, the term of this patent is extended or adjusted under 35 U.S.C. 154(b) by 0 days.

(21) Appl. No.: 14/941,114

(22) Filed: Nov. 13, 2015

(65) Prior Publication Data

US 2017/0139010 A1    May 18, 2017

(51) Int. Cl.
*G01R 31/327* (2006.01)
*G01R 31/02* (2006.01)

(52) U.S. Cl.
CPC ....... *G01R 31/3277* (2013.01); *G01R 31/025* (2013.01)

(58) Field of Classification Search
CPC .......................................... G01R 31/24–31/26
See application file for complete search history.

(56) References Cited

U.S. PATENT DOCUMENTS

| | | | |
|---|---|---|---|
| 6,580,990 B2 * | 6/2003 | Wager | B66F 9/07568 340/439 |
| 7,540,572 B2 | 6/2009 | Nakamura | |
| 2008/0042665 A1 * | 2/2008 | Rezvani | G01N 27/4165 324/713 |
| 2012/0112771 A1 * | 5/2012 | Schliebe | G01R 31/06 324/659 |
| 2012/0310582 A1 | 12/2012 | Al-Buaijan | |
| 2013/0027046 A1 * | 1/2013 | Leif | G01R 31/06 324/418 |
| 2015/0122229 A1 | 5/2015 | Dudar | |

FOREIGN PATENT DOCUMENTS

| | | |
|---|---|---|
| DE | 3922900 | 1/1991 |
| DE | 10260723 | 3/2004 |
| DE | 102006041193 | 3/2008 |
| EP | 2551684 | 1/2013 |
| GB | 2227076 A | 7/1990 |

OTHER PUBLICATIONS

Extended European Search Report dated May 4, 2017 in European Application No. 16198173.3.

* cited by examiner

*Primary Examiner* — Noam Reisner
(74) *Attorney, Agent, or Firm* — Snell & Wilmer L.L.P.

(57) ABSTRACT

Systems and methods for detecting circuit conditions are provided. A method for detecting a condition of a circuit may comprise: applying electrical energy to at least a circuit element in the circuit, a level of the electrical energy being insufficient to fully actuate the circuit element. The method may further comprise verifying integrity of the circuit.

8 Claims, 4 Drawing Sheets

FAULTY CIRCUIT DETECTION OF SHUT OFF VALVE

FIELD

The present disclosure relates generally to electrical systems on a vehicle and more specifically to systems and methods for detecting an open circuit.

BACKGROUND

Generally, shut off valves (SOVs) are operated either fully actuated (maximum current flow) or not-actuated (no current flow). To detect an open circuit condition in an SOV drive circuitry, wiring, or the SOV itself, the typical detection method is to observe the absence of current flow. However, it may not always be desirable to attempt to fully actuate the SOV in order to determine an open circuit condition.

SUMMARY

Systems and methods for detecting circuit conditions are provided. A method for detecting a fault in a circuit may comprise: applying electrical energy to at least a circuit element in the circuit, the electrical energy being insufficient to fully actuate the circuit element.

In various embodiments, the method may further comprise verifying integrity of the circuit. The applying may be performed for a pre-determined duration, the pre-determined duration being less than or equal to a time constant of the circuit, the time constant being equal to a time for at least a portion of the circuit to reach 63.2% of a steady state value. The pre-determined duration may be less than half of the time constant of the circuit. The pre-determined duration may be less than one tenth of the time constant of the circuit. The verifying the integrity of the circuit may include measuring a current through the circuit. The circuit element may comprise an electro-mechanical actuator. The fault may comprise at least one of a short circuit condition or an open circuit condition.

A system may comprise a valve in fluid communication with a brake assembly; a controller in electronic communication with the valve, the controller comprising at least a circuit; and a tangible, non-transitory memory configured to communicate with the controller, the tangible, non-transitory memory having instructions stored thereon that, in response to execution by the controller, cause the controller to perform operations comprising: applying a voltage across at least a portion of the circuit for a pre-determined duration, wherein the pre-determined duration is less than or equal to a time constant of the circuit.

In various embodiments, the instructions may cause the controller to perform operations further comprising: measuring a current through the circuit. The time constant may be equal to a time for a circuit element to reach 63.2% of a steady state value. The pre-determined duration may be less than half of the time constant of the circuit. The pre-determined duration may be less than one tenth of the time constant of the circuit. The valve may be a shut-off valve (SOV). The controller may be configured to control the valve.

A method for detecting a condition of a circuit element in a circuit may comprise: applying a voltage across the circuit element for a pre-determined duration, wherein the pre-determined duration is less than or equal to a time constant of the circuit; and measuring a current through the circuit element.

In various embodiments, the time constant is equal to a time for the current through the circuit element to reach 63.2% of a steady state value. The pre-determined duration may be less than half of the time constant of the circuit element. The pre-determined duration may be less than one tenth of the time constant of the circuit element. The circuit element may comprise an electro-mechanical actuator.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein. Thus, the detailed description herein is presented for purposes of illustration only and not of limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

As used herein, "electronic communication" means communication of electronic signals with physical coupling (e.g., "electrical communication" or "electrically coupled") or without physical coupling and via an electromagnetic field (e.g., "inductive communication" or "inductively coupled" or "inductive coupling").

Figure 4:
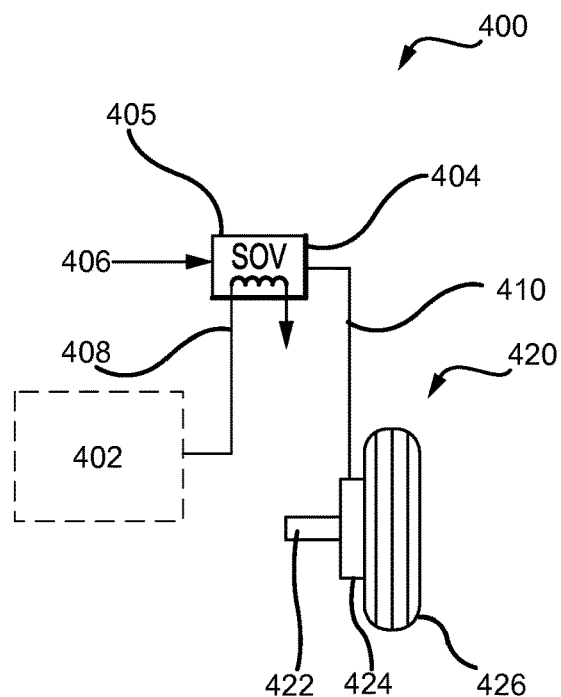
FIG. 4 illustrates a brake system, in accordance with various embodiments.

With reference to FIG. 4, a brake control system (hereinafter referred to as system) 400 is illustrated, in accordance with various embodiments. System 400 may include a controller 402, a valve assembly (hereinafter referred to as valve) 404, and a wheel assembly 420. Wheel assembly 420 may include a strut 422, a brake assembly 424, and a wheel 426.

FIG. 4 illustrates valve 404 as a shut-off valve (SOV). In various embodiments, valve 404 may comprise an electro-mechanical valve configured to actuate in response to a current supplied to valve 404. In various embodiments, valve 404 may comprise an electro-mechanical actuator 405. In various embodiments, valve 404 may receive hydraulic fluid 406. In various embodiments, valve 404 may be in electronic communication with controller 402. Valve 404 may be configured to actuate in response to a current supplied from controller 402. FIG. 4 illustrates valve 404 in electronic communication with controller 402 via wire 408. Controller 402 may comprise a circuit. Thus, valve 404 may comprise a circuit element. Controller 402 may be configured to control valve 404. Valve 404 may supply hydraulic fluid to brake assembly 424 for braking to slow or stop the rotation of wheel 426 about strut 422. Valve 404 may be in fluid communication with brake assembly 424. FIG. 4 illustrates valve 404 in fluid communication with brake assembly 424 via conduit 410.

In various embodiments, a circuit element may be configured to actuate or function at a fully engaged state and not actuate at anything less than a fully engaged state. For example, a shut off valve may be configured to actuate at a fully engaged state when a maximum current is flowing through the shut off valve and may be configured to not actuate when anything less than the maximum current is flowing through the shut off valve. Thus, a fault in a circuit may be detected by supplying electrical energy to the circuit. In various embodiments, a fault may comprise an open circuit condition. In various embodiments, a fault may comprise a short circuit condition.

In various embodiments, electrical energy may be applied to a circuit. Electrical energy may be applied via a voltage source or a current source. Electrical energy may be the time rate of power where power is defined in units of Watts. In various embodiments, power may be defined as voltage (V) times current (A).

Figure 1A:
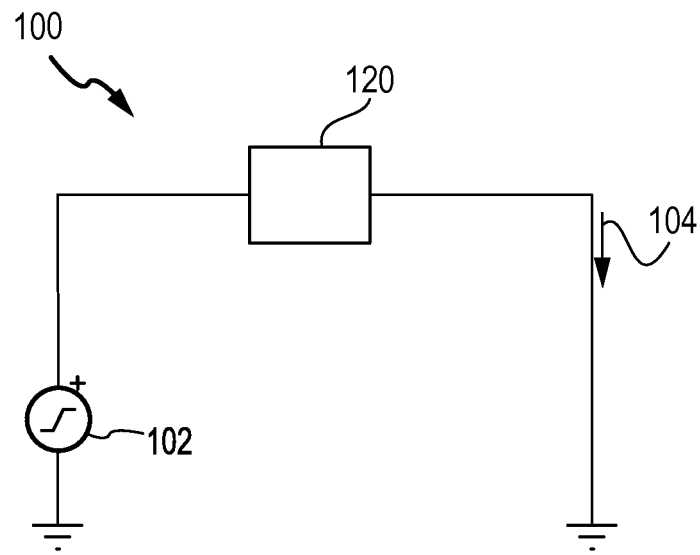
FIG. 1A illustrates a circuit, in accordance with various embodiments.

With reference to FIG. 1A, a circuit 100 is illustrated, in accordance with various embodiments. Circuit 100 may include one or more circuit elements 120. Circuit element 120 may comprise any element configured to function using electric power. In various embodiments, a current 104 may flow through circuit 100. In various embodiments, circuit 100 may include a voltage source 102. Voltage source may supply current 104 through element 120. In various embodiments, circuit 100 may be in a closed circuit condition.

With reference to FIG. 1A and FIG. 4, controller 402 may comprise voltage source 102, in accordance with various embodiments. In various embodiments, circuit element 120 may comprise valve 404.

Figure 1B:
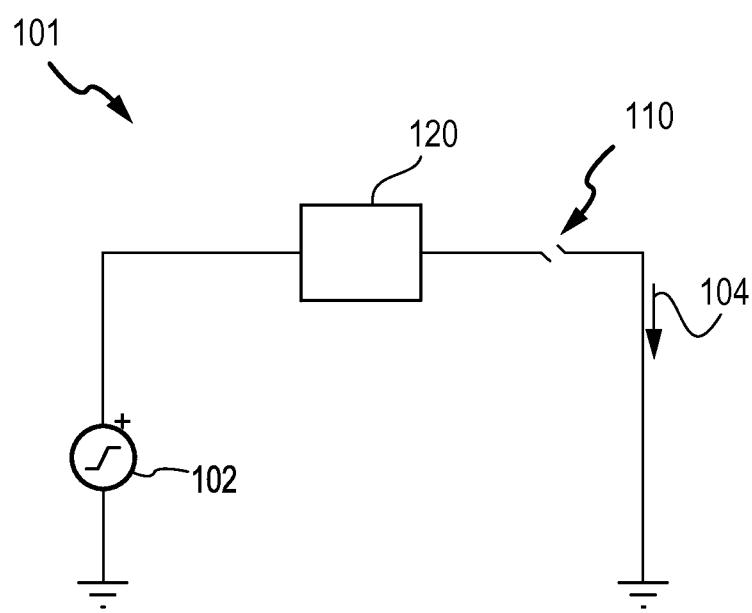
FIG. 1B illustrates a circuit, in accordance with various embodiments.

With respect to FIG. 1B, elements with like element numbering, as depicted in FIG. 1A, are intended to be the same and will not necessarily be repeated for the sake of clarity.

With reference to FIG. 1B, a circuit 101 is illustrated, in accordance with various embodiments. Circuit 101 may be similar to circuit 100. Circuit 101 may include an open 110. Open 110 may prevent current 104 from flowing through circuit 101. Open 110 may be a discontinuity in circuit 101. Thus, circuit 101 may be in an open circuit condition and element 120 may be prevented from actuating in response to an open 110. In various embodiments, open 110 may be located in any location of circuit 101. For example, open 110 may be located in circuit element 120.

Figure 2A:
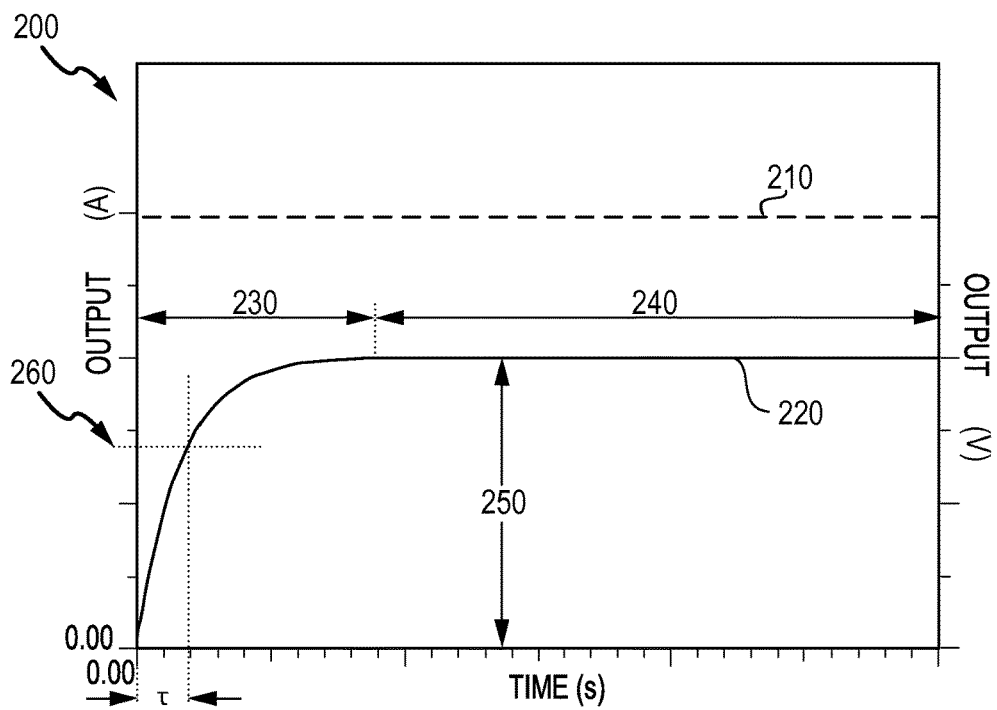
FIG. 2A illustrates a plot illustrating parameters of a circuit element, in accordance with various embodiments.

With further reference to FIG. 2A, a plot 200 illustrating parameters of a circuit element as illustrated by circuit 10 of FIG. 1A, is illustrated, in accordance with various embodiments. In various embodiments, voltage (also referred to herein as input voltage) 210 from voltage source 102 and current 220 through circuit element 120 is included in plot 200.

FIG. 2A illustrates plot 200 with two y-axes. The left y-axis measures current 220 in units of Amps (A). The right y-axis measures input voltage 210 in units of Volts (V).

An input voltage 210 may be applied across a circuit element at time zero to induce a current 220. As illustrated in FIG. 2A, current 220 may increase in first region (also referred to herein as charging region) 230 and may remain constant in second region (also referred to herein as full engagement region) 240. Current 220 may increase exponentially in charging region 230. Current 220 may comprise a steady state value (also referred to herein as full engagement value) 250 in full engagement region 240.

In various embodiments, circuit element 120 may comprise an inherent resistance and an inherent inductance which may induce a voltage across circuit element 120 as well as an inductance to circuit element 120. Thus, circuit 100 and circuit element 120 may comprise a time constant τ. Generally, time constant τ may be defined as the parameter characterizing the response to a step input of a first order, linear time-invariant (LTI) system. Time constant τ may be, by definition, the duration of time that it takes for current 104 flowing through circuit element 120 to reach 63.2% of its steady-state value 260 in response to input voltage 210 being applied across circuit element 120. Time constant τ may be defined as L/R for a circuit comprising an inductance L and a resistance R. Time constant τ may be defined as R*C for a circuit comprising a capacitance C and a resistance R.

Figure 2B:
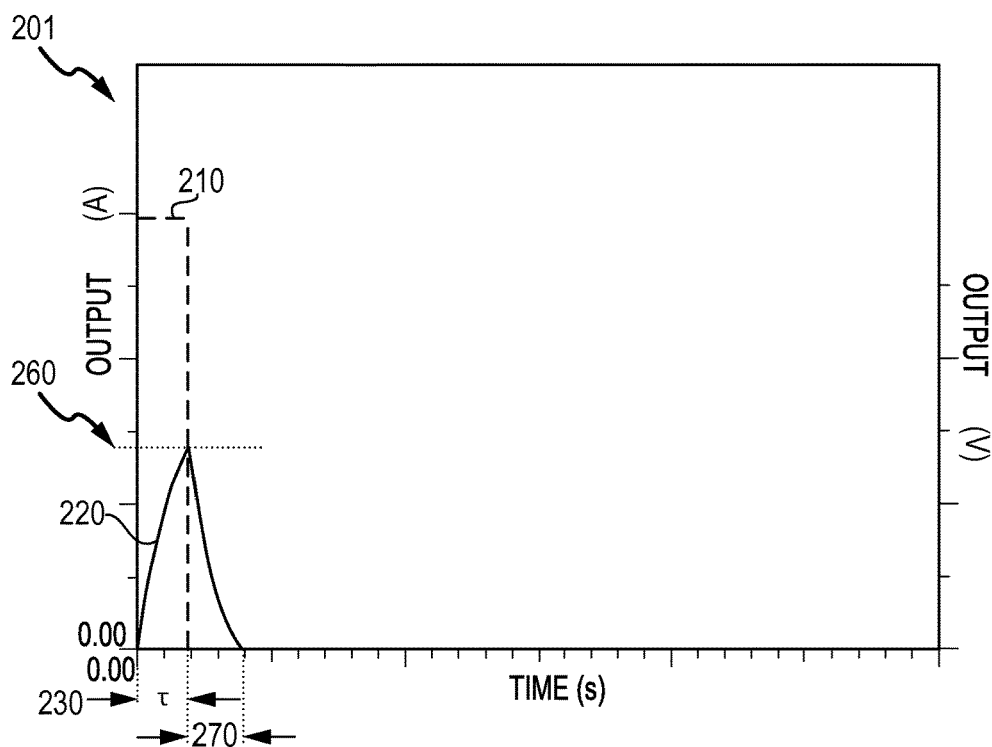
FIG. 2B illustrates a plot illustrating parameters of a circuit element with electrical energy being applied to the circuit element for a pre-determined duration, in accordance with various embodiments.

With respect to FIG. 2B, elements with like element numbering, as depicted in FIG. 2A, are intended to be the same and will not necessarily be repeated for the sake of clarity.

Figure 3:
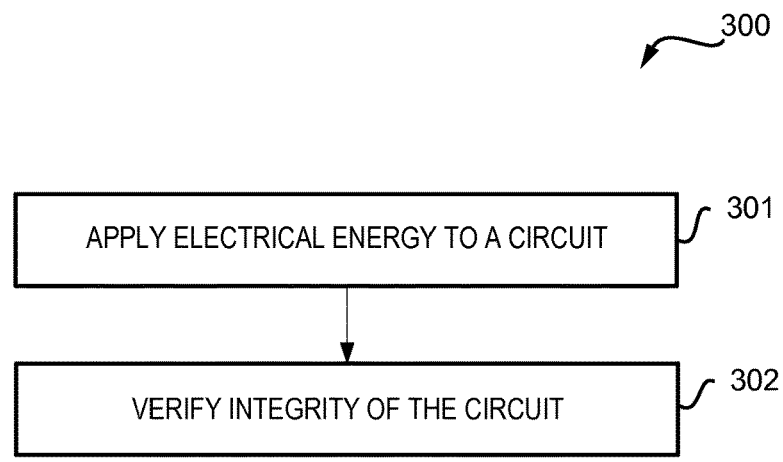
FIG. 3 illustrates a method for detecting a condition of a circuit, in accordance with various embodiments.

With further reference to FIG. 2B and FIG. 3, a method 300 for detecting a condition of a circuit is provided in FIG. 3, in accordance with various embodiments. In various embodiments, plot 201 may be similar to plot 200 of FIG. 2A. In various embodiments, input voltage 210 may be applied across circuit 100 for a pre-determined duration. Accordingly, an electrical energy may be applied to circuit 100 (see step 301). In various embodiments, the pre-determined duration may comprise a duration which is less than or equal to time constant $\tau$ (<$\tau$). In various embodiments, the pre-determined duration may comprise a duration which is less than half of time constant $\tau$ (<$\tau$/2). In various embodiments, the pre-determined duration may comprise a duration which is less than one tenth of time constant $\tau$ (<$\tau$/10). Current 220 flowing through circuit 100 may be measured during the pre-determined duration. Accordingly, the integrity of the circuit may be verified (see step 302).

As illustrated in FIG. 2B, input voltage 210 is applied across circuit 100 for a pre-determined duration comprising one time constant $\tau$. Thus, current 220 increases in charging region 230 and decreases in third region (also referred to herein as discharging region) 270. Accordingly, the maximum magnitude of current 220 reaches 63.2% of its steady-state value 260 and never reaches full engagement value 250. Thus, circuit 100 may be checked for any open circuit conditions by applying input voltage 210 across circuit 100 without actuating circuit element 120. In various embodiments, current 220 is a response to input voltage 210. FIG. 2B illustrates an exemplary response of current 220 through circuit element 120 to input voltage 210 as illustrated in circuit 100 of FIG. 1A. Thus, FIG. 2B illustrates a response to a circuit which does not have an open or otherwise faulty condition. Thus, a response as illustrated in FIG. 2B may indicate that a circuit is properly functioning.

Figure 2C:
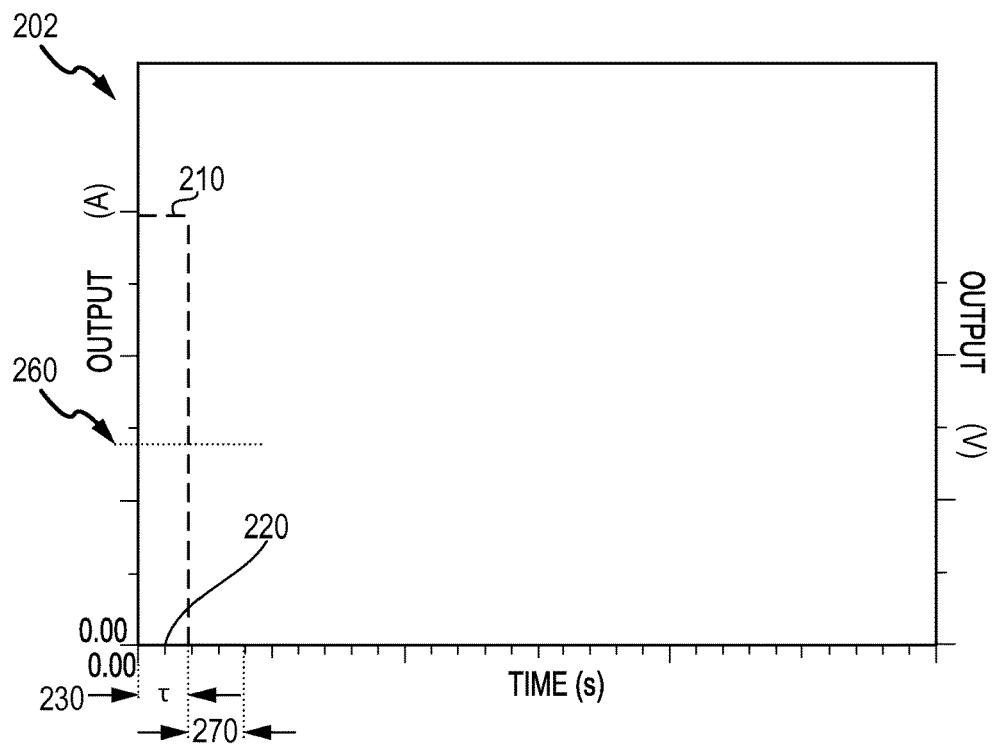
FIG. 2C illustrates a plot illustrating parameters of a faulty circuit element with electrical energy being applied to the circuit element for a pre-determined duration, in accordance with various embodiments.

With respect to FIG. 2C, elements with like element numbering, as depicted in FIG. 2B, are intended to be the same and will not necessarily be repeated for the sake of clarity.

With reference to FIG. 2C, a plot 202 illustrating parameters of a circuit element as illustrated by circuit 101 of FIG. 1B, is illustrated, in accordance with various embodiments. In various embodiments, current 220 may be zero in response to input current 210 when an open condition, such as open 110 (see FIG. 1B), is present in the circuit. Thus, a current 220 of zero in response to an input current 210 may indicate that a circuit contains an open, such as open 110 (see FIG. 1B). Stated another way, a current 220 of zero in response to an input current 210 may indicate discontinuity in the circuit or an otherwise faulty circuit or circuit element.

Figure 2D:
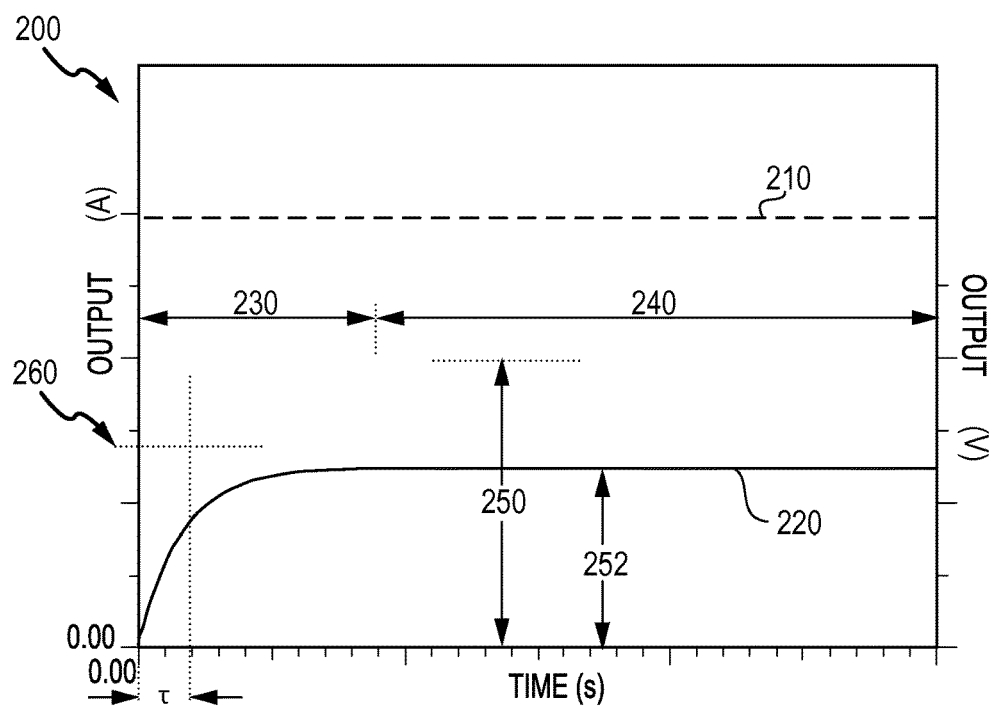
FIG. 2D illustrates a plot illustrating parameters of a circuit element with electrical energy being applied to the circuit element, in accordance with various embodiments.

With respect to FIG. 2D, elements with like element numbering, as depicted in FIG. 2A, are intended to be the same and will not necessarily be repeated for the sake of clarity.

With reference to FIG. 1A, FIG. 2D, & FIG. 3, input voltage 210 may comprise a value which is lower than the level needed to actuate or otherwise power valve 404 (see FIG. 4). In various embodiments, input voltage 210 may be applied across circuit 100. Accordingly, an electrical energy may be applied to circuit 100 (see step 301). Thus, current 220 may comprise a steady state value 252 which is less than full engagement value 250. In various embodiments, steady state value 252 may comprise a value which is less than 63.2% of full engagement value 250. Hence, input voltage 210 may be applied across circuit 100 for an indefinite amount of time without actuating valve 404 (see FIG. 4). Stated another way, the electrical energy applied to circuit 100 may be insufficient to fully actuate circuit element 120.

Although described herein in regards to verifying the integrity of a circuit under open circuit conditions. The methods as described herein may be used for detecting a faulty circuit having a short circuit condition. With temporary reference to FIG. 1A, the resistance across a circuit, such as circuit 100 for example, having a short circuit condition may decrease resulting in an increase in current. Furthermore, a short circuit condition may decrease inductance of a circuit and thus, decrease a time constant ($\tau$) of the circuit. Accordingly, a short circuit condition may be detected.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for detecting a fault in a circuit configured for communication with a brake control system of an aircraft, comprising:

applying electrical energy to at least a circuit element of an electromechanical shut-off valve configured to actuate in response to a current supplied to the shut-off valve and to supply hydraulic fluid brake control system of the aircraft for braking a rotation of a wheel of the aircraft, the electrical energy being insufficient to fully actuate the circuit element;

verifying integrity of the circuit by measuring a current through the circuit, during a charging region, wherein the current increases exponentially within the charging region; and discharging the electrical energy during a discharging region;

wherein the applying is performed for a pre-determined duration, less than or equal to a time for at least a portion of the circuit to reach 63.2% of a steady state value;

wherein the discharging occurs after the pre-determined duration;

wherein the circuit element is configured to fully actuate when a maximum current flows through the shut-off valve; and wherein the circuit element is configured to fully actuate in response to the circuit reaching the steady state value and configured to remain non-actuated in response to the circuit being below the steady state value.

2. The method of claim 1, wherein the pre-determined duration is less than one tenth of a time constant of the circuit.

3. The method of claim 1, wherein the fault comprises at least one of a short circuit condition or an open circuit condition.

4. A brake control system for an aircraft comprising:

an electromechanical shut-off valve in fluid communication with the brake control system of the aircraft for braking a rotation of a wheel of the aircraft, wherein the shut-off valve is configured to actuate in response to a current comprising at least a full engagement value supplied to the shut-off valve;

a controller in electronic communication with the shut-off valve, the controller comprising at least a circuit in communication with the brake control system of the aircraft; and a tangible, non-transitory memory configured to communicate with the controller, the tangible, non-transitory memory having instructions stored thereon that, in response to execution by the controller, cause the controller to perform operations comprising:

applying a voltage across at least a portion of the circuit for a pre-determined duration, less than or equal to a time for at least a portion of the circuit to reach 63.2% of a steady state value, wherein the current is less than the full engagement value in response to the voltage being applied for the pre-determined duration;

verifying the integrity of the circuit by measuring a current through the circuit during a charging region, wherein the current increases exponentially within the charging region.

5. The system of claim 4, wherein the pre-determined duration is less than one tenth of the time constant of the circuit.

6. The system of claim 4, wherein the controller is configured to control the shut-off valve.

7. A method for detecting a condition of an electromechanical shut-off valve in a brake control system of an aircraft comprising a circuit, the method comprising:

applying a voltage across the shut-off valve for a pre-determined duration, less than or equal to a time for at least a portion of the circuit to reach 63.2% of a steady state value; and verifying integrity of the circuit by measuring a current through the shut-off valve during a charging region, wherein the current increases exponentially within the charging region.

8. The method of claim 7, wherein the pre-determined duration is less than one tenth of the time constant of the shut-off valve.

* * * * *